(12) United States Patent
Bailey et al.

(10) Patent No.: US 6,600,373 B1
(45) Date of Patent: Jul. 29, 2003

(54) METHOD AND CIRCUIT FOR TUNING A TRANSCONDUCTANCE AMPLIFIER

(75) Inventors: James Arthur Bailey, Snowflake, AZ (US); Randall Russell Pratt, West Orange, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/209,335

(22) Filed: Jul. 31, 2002

(51) Int. Cl.$^7$ ............................................... H03F 3/45
(52) U.S. Cl. ........................ 330/260; 330/258; 330/305; 330/306
(58) Field of Search ....................... 330/85, 258, 260, 330/305, 306, 84, 124 R, 295

(56) References Cited

U.S. PATENT DOCUMENTS

| | | | |
|---|---|---|---|
| 5,182,477 A | 1/1993 | Yamasaki et al. ............ 307/494 |
| 5,357,208 A * | 10/1994 | Nelson ........................ 330/126 |
| 5,440,264 A | 8/1995 | Sevenhans et al. .......... 327/553 |
| 5,510,751 A * | 4/1996 | Nauta ........................... 330/84 |
| 5,530,399 A | 6/1996 | Chambers et al. ........... 327/561 |
| 5,578,965 A | 11/1996 | Kimura ....................... 330/254 |
| 5,661,432 A | 8/1997 | Chang et al. ................ 327/552 |
| 5,726,600 A | 3/1998 | Raghavan et al. ........... 327/553 |
| 5,789,973 A * | 8/1998 | Barrett, Jr. et al. .......... 327/561 |
| 5,978,241 A | 11/1999 | Lee .............................. 363/73 |
| 5,999,055 A | 12/1999 | Kimura ....................... 330/255 |
| 6,111,467 A | 8/2000 | Luo ............................. 330/305 |
| 6,172,569 B1 | 1/2001 | McCall et al. ............... 330/303 |
| 6,304,135 B1 | 10/2001 | Muza ........................... 327/553 |
| 6,335,655 B1 * | 1/2002 | Yamamoto ................... 327/552 |

OTHER PUBLICATIONS

Mehr et al., "A CMOS Continuous–Time $G_m$–C Filter for PRML Read Channel Applications at 150 Mb/s and Beyond", IEEE Journal of Solid–State Circuits, vol. 32, No. 4, pp. 499–513, Apr. 1997.
Pavan et al., High Frequency Continuous Time Filters in Digital CMDS, Kluwer Academic Publishers, Norwell, MA, pp. 109–115, 2000.

* cited by examiner

*Primary Examiner*—Henry Choe
(74) *Attorney, Agent, or Firm*—Duane Morris LLP; Steven E. Koffs

(57) ABSTRACT

A circuit for tuning a transconductance amplifier includes a first transconductance amplifier outputting a first current from its output, a second transconductance amplifier outputting a second current from an output that is coupled to the output of the first transconductance amplifier, and a feedback loop. The feedback loop provides a control signal that varies with a difference between the first current and the second current and is used to adjust the transconductance of the second transconductance amplifier.

24 Claims, 3 Drawing Sheets

METHOD AND CIRCUIT FOR TUNING A TRANSCONDUCTANCE AMPLIFIER

FIELD OF THE INVENTION

The present invention is related to circuits generally, and more specifically to a method for tuning a transconductance amplifier.

BACKGROUND OF THE INVENTION

Transconductance filters are used in a variety of electronic circuits that perform filtering functions. Typically, these filters incorporate a transconductance amplifier that receives a voltage input signal and outputs a controlled current signal, where the controlled current signal equals the product of the transconductance gain $g_m$ of the amplifier and the voltage input signal applied to the amplifier.

A variety of methods have been used in the prior art to tune transconductance filter circuits. U.S. Pat. No. 6,172,569 describes use of a potentiometer to adjust the amplitude of the analog control signal applied to a transconductance amplifier, as well as use of a digital-to-analog converter (DAC) to convert a digital control signal to an analog signal prior to applying it to the transconductance amplifier, thus allowing digital control of the transconductance filter characteristics. By varying the control signal applied to the transconductance amplifier, the maximum gain of the transconductance filter can be adjusted, which shifts the unity gain frequency along the frequency axis.

Mehr et al., "A CMOS Continuous-Time Gm-C filter for PRML Read Channel Applications at 150 Mb/s and Beyond," IEEE Journal of Solid-State Circuits, Vol. 32, No. 4, Apr. 1997, pp 499–513 describes a tuning circuit that requires a relatively accurate reference clock period. In such a circuit, some of the clock signals can become coupled into the actual filter through the control voltage line. This can introduce undesirable signal components in the filter, producing unwanted side bands and frequency modulation of the signal that's being processed.

An improved method and circuit for adjusting a transconductance amplifier is desired.

SUMMARY OF THE INVENTION

One aspect of the invention is a method for tuning a transconductance amplifier. A first current is output from an output of a first transconductance amplifier. A second current is output from an output of a second transconductance amplifier that is coupled to the output of the first transconductance amplifier. The transconductance of the second transconductance amplifier is adjusted until the second current is equal in magnitude to and opposite in polarity from the first current.

Another aspect of the invention is a circuit for tuning a transconductance amplifier, comprising a first transconductance amplifier outputting a first current from an output thereof, a second transconductance amplifier outputting a second current from an output that is coupled to the output of the first transconductance amplifier, and a feedback loop. The feedback loop provides a control signal that varies with a difference between the first current and the second current and is used to adjust the transconductance of the second transconductance amplifier.

DETAILED DESCRIPTION

Figure 1:
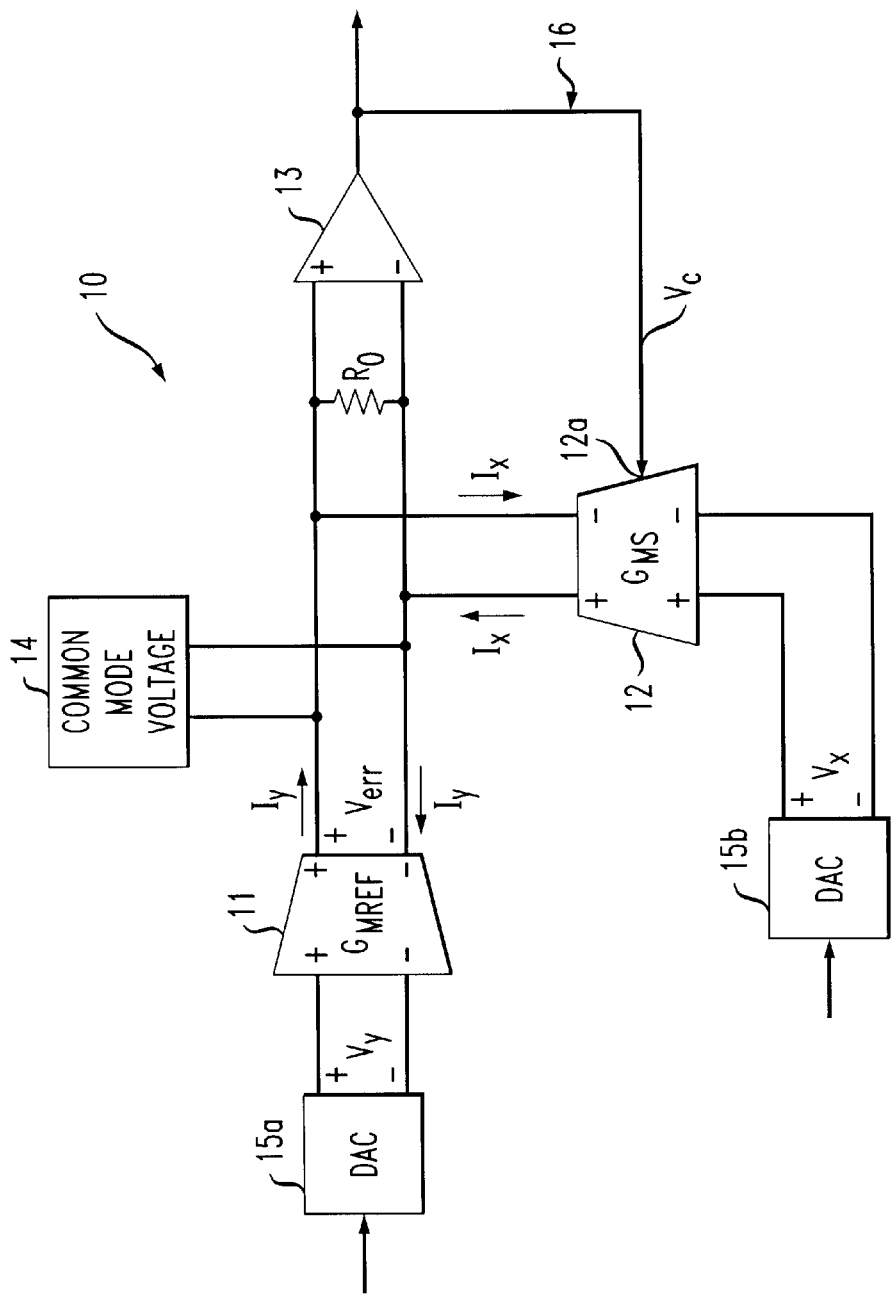
FIG. 1 is a block diagram of a first exemplary embodiment of a circuit for tuning a tunable transconductance amplifier.

FIG. 1 is a block diagram of an exemplary circuit 10 for tuning a transconductance amplifier 12 that results in a predictable controllable transconductance $g_{ms}$.

A first transconductance amplifier 11 outputs a first current $I_y$ from its output. The first transconductance amplifier 11 has a fixed reference transconductance $g_{mref}$.

Figure 3:
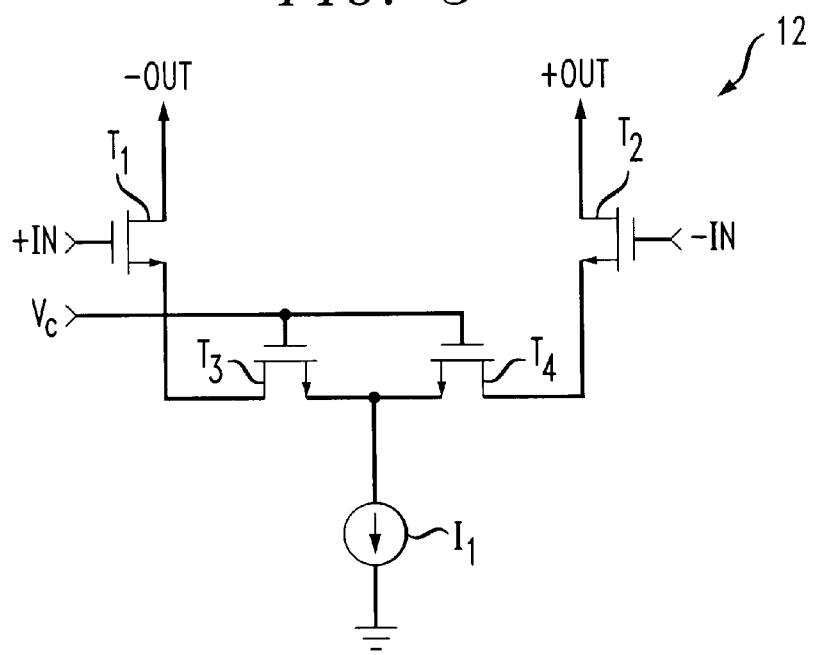
FIG. 3 is a schematic diagram of a tunable source degenerated transconductance amplifier which may be used in the circuit of FIG. 1.

A second transconductance amplifier (transconductance cell) 12 outputs a second current $I_x$ from its output. The second transconductance amplifier 12 has a tunable transconductance $g_{ms}$. In the embodiment of FIG. 1, amplifier 12 may be a source degenerated transconductance cell, such as that shown in FIG. 3. In FIG. 3, transistors $T_3$ and $T_4$ are operated in "triode" mode. $V_c$ is connected to the gates of transistors $T_3$ and $T_4$, controlling the drain-source resistance of $T_3$ and $T_4$, thus varying the source degeneration of the transconductance amplifier 12.

One of ordinary skill can substitute another source degenerated transconductance amplifier, or a transconductance amplifier having other means of tunability, such as, for example, any of these described in U.S. Pat. No. 5,999,055, which is incorporated by reference herein. The output of the second transconductance amplifier 12 is coupled to the output of the first transconductance amplifier 11.

Referring again to FIG. 1, a feedback loop 16 provides the control signal. $V_c$ that varies with a difference between the first current $I_y$ and the second current $I_x$. The control signal $V_c$ is used to adjust the transconductance $g_{ms}$ of the second transconductance amplifier 12.

The exemplary feedback loop 16 includes a differential amplifier (error amplifier) 13 that receives a portion of the first current $I_y$ and a portion of the second current $I_x$ and outputs the control signal $V_c$. The error signal ($V_{err}$) input to amplifier 13 has a substantially zero magnitude when the second current $I_x$ is equal in magnitude to and opposite in polarity from the first current $I_y$. Because amplifier 13 has a high gain, a signal $V_c$ having sufficient range for use as a control signal is obtained even where the input $V_{err}$ has a very small magnitude.

In exemplary circuit 10, a constant common mode voltage circuit 14 is coupled to the outputs of the first transconductance amplifier 11 and second transconductance amplifier 12. The exemplary means for producing the reference voltages $V_y$ and $V_x$ include voltage-mode DAC's 15a and 15b, respectively, but could include bandgap references or other means for producing a reference voltage. The common mode sensing element measures the average voltage of the two differential outputs from the $g_m$ cells 11 and 12, takes those two output voltages and averages them. It monitors the actual common mode voltage and adjusts the current into the outputs and feeds equal current into each one until the actual output voltage or common mode output voltage equals the common mode reference that's applied.

The variable transconductance cell 12 includes an adjustment terminal 12a connected to the output of error amplifier 13. For simplicity, the transconductance of 12 can be written as:

$$g_{ms} = kV_c \quad (1)$$

where k is the constant defining the transconductance $g_{ms}$ as a function of control voltage $V_c$. The output of the error amplifier 13 is given by:

$$V_c = V_{err} A_e \quad (2)$$

where $A_e$ is the gain of error amplifier and $V_{err}$ is the differential output voltage of the network. If $r_O$ is defined as the combined differential output impedance of the two transconductance amplifiers 11 and 12 and common-mode control block 14 and the input impedance of the error amplifier 13, the error voltage, $V_{err}$ can be written:

$$V_{err} = (I_y - I_x) r_O \quad (3)$$

where the output currents of the transconductance amplifiers $I_y$ and $I_x$ are defined by:

$$I_y = V_y g_{mref} \quad (4)$$

$$I_x = V_x g_{ms} \quad (5)$$

combining equations (3) and (2):

$$V_c = (I_y - I_x) r_O A_e \quad (6)$$

Substituting equations (4) and (5) for $I_y$ and $I_x$:

$$V_c = (V_y g_{mref} - V_x g_{ms}) r_O A_e \quad (7)$$

From equation (1), $V_c$ can be expressed as:

$$V_c = g_{ms}/k \quad (8)$$

and equating the expressions of equations (7) and (8) yields:

$$V_c = g_{ms}/k = (V_y g_{mref} - V_x g_{ms}) r_O A_e \quad (9)$$

solving equation (9) for $g_{ms}$:

$$g_{ms} = (V_y g_{mref} r_O A_e) / (1/k + V_x r_O A_e) \quad (10)$$

For cases where $V_x r_O A_e \gg 1/k$ (easily achieved with operational amplifiers and practical output impedance), equation (10) can be simplified to:

$$g_{ms} \approx g_{mref} V_y / V_x \quad (11)$$

Thus, the transconductance of the second transconductance amplifier 12 after the feedback is applied is a function of a ratio of an input voltage $V_y$ of the first transconductance amplifier 11 to the input voltage $V_x$ of the second transconductance amplifier 12. By using adjustable sources for $V_x$ and $V_y$ such as digital-analog converters 15a and 15b, the resulting source-degenerated transconductance of amplifier 12 can be tuned over a broad range.

The exemplary tuning technique and circuit is a DC implementation. There is no switching involved, so clocking is not required. Because it does not require a clock signal, there is no need to be concerned about couplings from the clock signal's path. With no clock signal coupled into the actual filter through the control voltage line 16, undesirable components (e.g., sidebands, frequency modulation) are not introduced into the filter 20.

Figure 2:
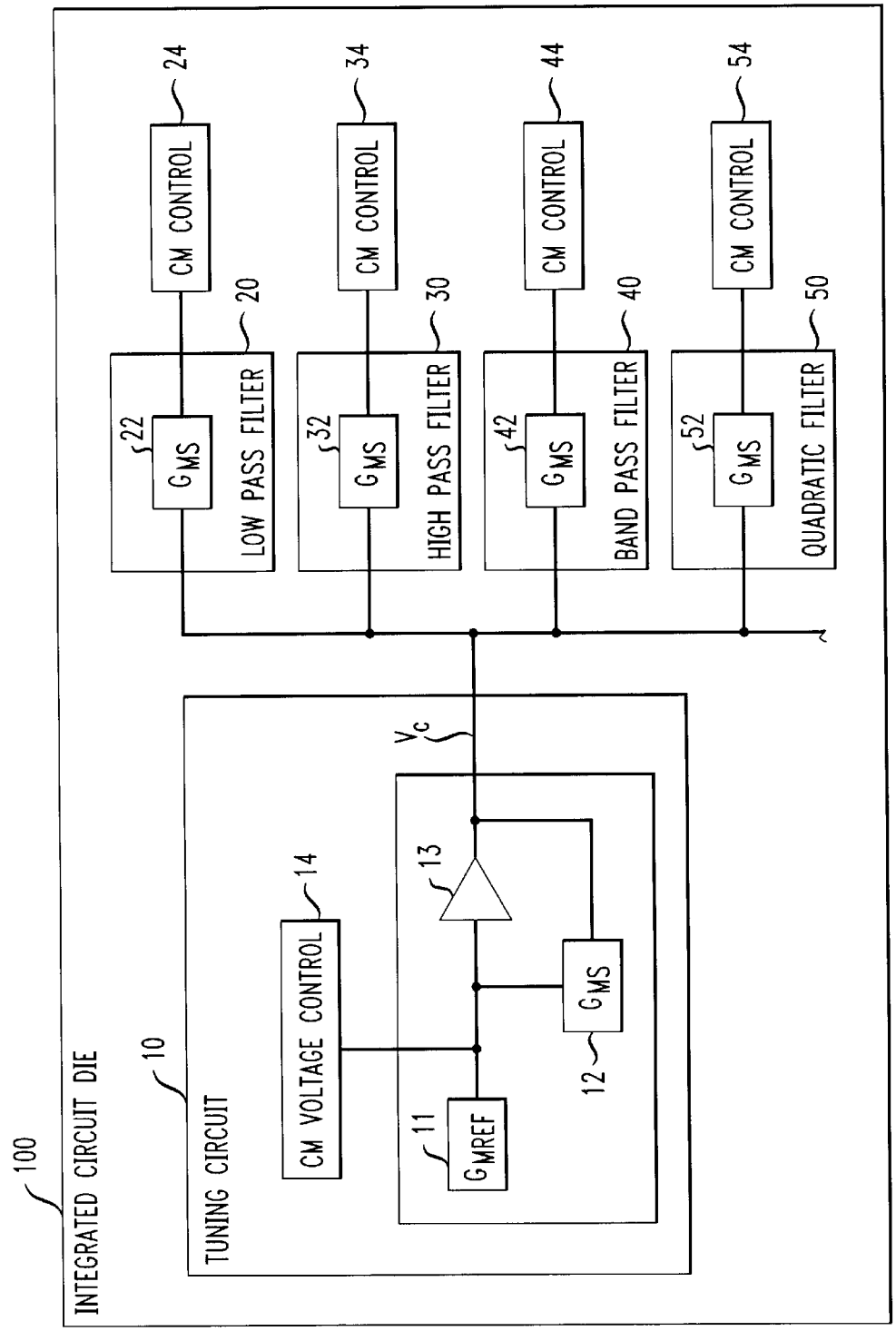
FIG. 2 is a block diagram of an IC that includes the circuit of FIG. 1 for tuning a plurality filters having respective transconductance amplifiers.

FIG. 2 is a block diagram of an exemplary integrated circuit (IC) 100 that includes the tuning circuit 10. Details of circuit 10 are omitted from FIG. 2 for brevity, but are understood to be included in an actual embodiment. As shown in FIG. 2, the second transconductance amplifier 12 is included in a tuning circuit 10. Circuit 10 can provide the control signal $V_c$ used to control a third transconductance amplifier 22 in a first filter 20. For example, the cut-off frequency of the filter 20 may be tuned based on the adjustment to the transconductance $g_{ms}$ of the tuned transconductance amplifier 22. The filter 20 includes other devices (e.g., transistors, capacitors, resistors and the like), which are not shown. One of ordinary skill in the art can readily select the additional circuit elements to construct any desired type of filter.

Further, the control signal $V_c$ may be fed from the differential amplifier 13 to a fourth transconductance amplifier 32 included in a second filter 30, in order to adjust the transconductance of the fourth transconductance amplifier 32. There is no need for duplicating reference transconductance amplifier 11, differential (error) amplifier 13 or common mode voltage source 14 in the second filter 30.

The IC 100 may further include additional filters 40 and 50 that include respective tunable transconductance amplifiers 42 and 52 that can be tuned by the same control signal $V_c$. Although the example of FIG. 2 includes a low pass filter 20, a high pass filter 30, a band pass filter 40 and a quadratic filter 50, the IC 100 may include any number of filters of any types that use tunable transconductance amplifiers. For example, a typical IC may include 20 or more source-degenerated $g_{ms}$ cells in filters of various types.

In this example, a single reference transconductance amplifier 11 and a single differential amplifier 13 may be used for tuning a plurality of tunable transconductance amplifiers 12, 22, 32, 42, 52 and the like. The same control signal $V_c$ is used for the additional tunable transconductance amplifiers 22, 32, 42 and 52. It is not necessary to provide an individual reference transconductance amplifier 11 or differential (error) amplifier 13 for tuning the respective transconductance of each additional transconductance amplifier on the same integrated circuit 100. Each gm cell 22, 32, 42, and 52 is connected to a respective common mode control circuit 24, 34, 44 and 54, respectively.

The source degenerated transconductance amplifier 12 of FIGS. 1 and 3 provides tunability and also improves the linearity of the transconductance amplifier 12 which is an advantage. Although the exemplary embodiment of FIG. 1 may include a source-degenerated transconductance amplifier 12, other types of transconductance amplifiers may be tuned using the method described herein. For example, the same technique may be applied to a circuit including bipolar transistors, wherein the tunable amplifier is an emitter degenerated transconductance amplifier.

Further, a non-source degenerated transconductance amplifier 112 (shown in FIG. 4) may be used, although the range of tunability is not as large for a non-source degenerated $g_m$ cell. Because there is no variable source-degeneration resistor available to tune the transconductance of the input differential pair of MOSFETs, an alternative tuning method is used to control the non-source degenerated transconductance amplifier.

Figure 4:
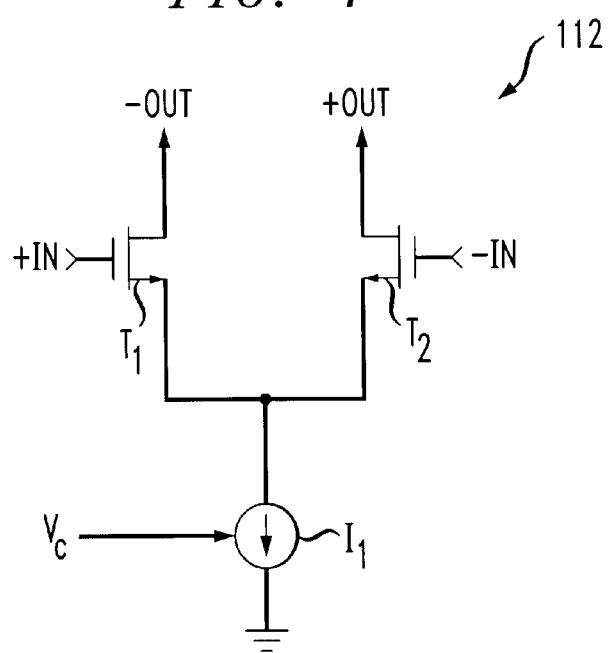
FIG. 4 is a schematic diagram of an exemplary tunable transconductance amplifier without source degeneration, which may be used in the circuit shown in FIG. 1.

FIG. 4 shows an exemplary tunable transconductance amplifier 112 which can be substituted in the circuit of FIG. 1. An exemplary technique for a $g_m$ cell 112 made with MOSFETs $T_1$ and $T_2$ (which are not source degenerated) would be to adjust the source current from $I_1$. The $g_m$ cell 112 can be considered as a simple differential amplifier with the sources of transistors $T_1$ and $T_2$ tied together. The current source $I_1$ is provided between ground and the sources of transistors $T_1$ and $T_2$. The current source $I_1$ can be adjusted to tune the $g_m$ 112.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for tuning a transconductance amplifier, comprising the steps of:
    outputting a first current from an output of a first transconductance amplifier;
    outputting a second current from an output of a second transconductance amplifier that is coupled to the output of the first transconductance amplifier; and
    adjusting the transconductance of the second transconductance amplifier until the second current is equal in magnitude to and opposite in polarity from the first current.

2. The method of claim 1, wherein the first transconductance amplifier has a fixed reference transconductance.

3. The method of claim 1, further comprising inputting a portion of the first current and a portion of the second current into a differential amplifier.

4. The method of claim 3, further comprising feeding back a control signal from the differential amplifier to the second transconductance amplifier, in order to adjust the transconductance of the second transconductance amplifier.

5. The method of claim 4, wherein an error signal provided to the differential amplifier has a substantially zero magnitude when the second current is equal in magnitude to and opposite in polarity from the first current.

6. The method of claim 4, further comprising feeding the control signal from the differential amplifier to a third transconductance amplifier included in a first filter, in order to adjust the transconductance of the third transconductance amplifier.

7. The method of claim 6, wherein the third transconductance amplifier is included in an integrated circuit having a plurality of tunable transconductance amplifiers, the method further comprising feeding the control signal from the differential amplifier to each of the plurality of tunable transconductance amplifiers included in the integrated circuit, in order to adjust the respective transconductance of each respective tunable transconductance amplifier.

8. The method of claim 1, wherein the outputs of the first and second transconductance amplifiers are maintained at a common mode voltage.

9. The method of claim 1, wherein the transconductance of the second transconductance amplifier after the adjusting is a function of a ratio of an input voltage of the first transconductance amplifier to an input voltage of the second transconductance amplifier.

10. The method of claim 1, wherein:
    the first transconductance amplifier has an input voltage of $V_y$; the second transconductance amplifier has an input voltage of $V_x$; the first transconductance amplifier has a transconductance $g_{mref}$; and
    the second transconductance amplifier has a transconductance $g_{ms}$ approximately given by the equation:

$$g_{ms} \approx g_{mref}\, V_y/V_x.$$

11. The method of claim 1, further comprising tuning a cut-off frequency of a filter based on the adjustment to the transconductance of the second transconductance amplifier.

12. A circuit for tuning a transconductance amplifier, comprising:
    a first transconductance amplifier outputting a first current from an output thereof;
    second transconductance amplifier outputting a second current from an output that is coupled to the output of the first transconductance amplifier; and
    a feedback loop providing a control signal that varies with a difference between the first current and the second current and is used to adjust the transconductance of the second transconductance amplifier, the feedback loop including a differential amplifier,
    wherein an error signal provided to the differential amplifier has a substantially zero magnitude when the second current is equal in magnitude to and opposite in polarity from the first current.

13. The circuit of claim 12, wherein the first transconductance amplifier has a fixed reference transconductance.

14. The circuit of claim 12, wherein the feedback loop outputs the control signal.

15. The circuit of claim 12, further comprising a common mode voltage circuit coupled to the outputs of the first and second transconductance amplifiers.

16. The circuit of claim 12, wherein the transconductance of the second transconductance amplifier after the adjusting is a function of a ratio of an input voltage of the first transconductance amplifier to an input voltage of the second transconductance amplifier.

17. The circuit of claim 12, wherein:
    the first transconductance amplifier has an input voltage of $V_y$;
    the second transconductance amplifier has an input voltage of $V_x$;
    the first transconductance amplifier has a transconductance $g_{mref}$; and
    the second transconductance amplifier has a transconductance $g_{ms}$ approximately given by the equation:

$$g_{ms} \approx g_{mref}\, V_y/V_x.$$

18. A circuit for tuning a transconductance amplifier, comprising:
    a first transconductance amplifier outputting a first current from an output thereof;
    second transconductance amplifier outputting a second current from an output that is coupled to the output of the first transconductance amplifier;
    a feedback loop providing a control signal that varies with a difference between the first current and the second current and is used to adjust the transconductance of the second transconductance amplifier, the feedback loop including a differential amplifier that receives a portion of the first current and a portion of the second current and outputs the control signal; and
    a third transconductance amplifier included in a first filter, wherein the control signal is fed from the differential amplifier to the third transconductance amplifier, in order to adjust the transconductance of the third transconductance amplifier.

19. The circuit of claim 18, wherein the third transconductance amplifier is included in an integrated circuit having a plurality of tunable transconductance amplifiers, and the control signal is fed from the differential amplifier to each of the plurality of tunable transconductance amplifiers included in the integrated circuit, in order to adjust the respective transconductance of each respective tunable transconductance amplifier.

20. A circuit for tuning a transconductance amplifier, comprising:

a first transconductance amplifier outputting a first current from an output thereof;

second transconductance amplifier outputting a second current from an output that is coupled to the output of the first transconductance amplifier; and a feedback loop providing a control signal that varies with a difference between the first current and the second current and is used to adjust the transconductance of the second transconductance amplifier, wherein a third transconductance amplifier is included in a filter, and a cut-off frequency of the filter is tuned based on the adjustment to the transconductance of the third transconductance amplifier.

21. An integrated circuit including a tuning circuit comprising:

a first transconductance amplifier outputting a first current from an output thereof;

second transconductance amplifier outputting a second current from an output that is coupled to the output of the first transconductance amplifier; and a feedback loop providing a control signal that varies with a difference between the first current and the second current and is used to adjust the transconductance of the second transconductance amplifier.

22. The integrated circuit of claim 21, further including a first filter having a third transconductance amplifier that receives and is tuned by the control signal.

23. The integrated circuit of claim 21, further comprising a plurality of tunable transconductance amplifiers, each receiving and tuned by the control signal.

24. The integrated circuit of claim 21, further comprising a plurality of filters, each filter having a respective tunable transconductance amplifier, each respective tunable transconductance amplifier receiving and tuned by the control signal.

* * * * *